(12) United States Patent
Shiraiwa et al.

(10) Patent No.: US 7,232,724 B1
(45) Date of Patent: Jun. 19, 2007

(54) RADICAL OXIDATION FOR BITLINE OXIDE OF SONOS

(75) Inventors: Hidehiko Shiraiwa, San Jose, CA (US); Joong Jeon, Cupertino, CA (US); Weidong Qian, Sunnyvale, CA (US)

(73) Assignees: Advanced Micro Devices, Inc., Austin, TX (US); Spansion LLC, Sunnyvale, CA (US)

( * ) Notice: Subject to any disclaimer, the term of this patent is extended or adjusted under 35 U.S.C. 154(b) by 99 days.

(21) Appl. No.: 11/113,507

(22) Filed: Apr. 25, 2005

(51) Int. Cl.
*H01L 21/336* (2006.01)

(52) U.S. Cl. ............... 438/262; 438/279; 438/288; 438/771

(58) Field of Classification Search ............ 438/262, 438/275–279, 288, 770–772
See application file for complete search history.

(56) References Cited

U.S. PATENT DOCUMENTS

| | | | |
|---|---|---|---|
| 5,168,334 A | | 12/1992 | Mitchell et al. |
| 5,966,603 A | * | 10/1999 | Eitan ............... 438/258 |
| 6,541,816 B2 | | 4/2003 | Ramsbey et al. |
| 6,555,436 B2 | | 4/2003 | Ramsbey et al. |
| 6,613,632 B2 | * | 9/2003 | Liu et al. ............... 438/261 |
| 6,670,246 B1 | * | 12/2003 | Hsiao et al. ............... 438/276 |
| 6,797,565 B1 | | 9/2004 | Yang et al. |
| 6,803,275 B1 | | 10/2004 | Park et al. |
| 7,033,957 B1 | * | 4/2006 | Shiraiwa et al. ............ 438/770 |
| 2005/0115946 A1 | * | 6/2005 | Shim et al. ............... 219/390 |
| 2006/0035418 A1 | * | 2/2006 | Yoshida et al. ............ 438/149 |

* cited by examiner

*Primary Examiner*—M. Wilczewski
*Assistant Examiner*—Toniae M. Thomas
(74) *Attorney, Agent, or Firm*—Eschweiler & Associates, LLC

(57) ABSTRACT

Methods are disclosed for fabricating multi-bit SONOS flash memory cells, comprising forming a first dielectric layer and a charge trapping layer over a substrate of a wafer and selectively etching the dielectric and charge trapping layers down to a substrate region to form a bitline opening, then implanting a dopant ion species into the substrate associated with the bitline opening in a bitline region. A radical oxidation process is then used to form a second dielectric layer of a triple layer dielectric-charge trapping-dielectric stack over the charge trapping layer and to fill the bitline opening in the bitline regions of the wafer. Finally, a wordline structure is then formed over the triple layer dielectric-charge trapping-dielectric stack and the bitline regions of the wafer. A multi-bit flash memory array is also disclosed, comprising a bitline region in a substrate, a first dielectric layer overlying the substrate substantially adjacent to and substantially exposing the bitline region, a charge trapping layer overlying the first dielectric layer substantially adjacent to and substantially exposing the bitline region, a bitline oxide isolation structure or layer extending continuously over the bitline region and charge trapping layer, the isolation structure comprising a single dielectric material layer formed by the radical oxidation process, and a conductive wordline overlying the bitline oxide isolation structure or layer.

14 Claims, 8 Drawing Sheets

RADICAL OXIDATION FOR BITLINE OXIDE OF SONOS

FIELD OF INVENTION

The present invention relates generally to semiconductor device processing and more particularly to a method and system for fabricating flash memory cells in a semiconductor device.

BACKGROUND OF THE INVENTION

Flash and other types of electronic memory devices are constructed of memory cells operative to individually store and provide access to binary information or data. The memory cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry using wordlines and bitlines. Conventional flash memories are constructed in a cell structure wherein one or more bits of information or data are stored in each flash memory cell. In typical single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well.

The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

Other types of memory devices include ones comprising silicon or polysilicon above and below an ONO layer, these silicon-oxide-nitride-oxide-silicon devices are sometimes referred to as SONOS memory devices. Such devices may include physical dual bit memory cells, individually adapted to store two binary bits of data by localized charge trapping. The SONOS memory devices provide data retention with a thin bottom oxide, low-voltage operation, and fast programming speed.

Dual bit memory cells are generally symmetrical, including two identical and interchangeable source/drain regions. Application of appropriate voltages to the gate, drain, and source terminals allows access to one of the two bits (e.g., for read, program, erase, verify, or other operations). Core cells in flash memory devices, whether single bit or multiple-bit, may be interconnected in a variety of different configurations. For instance, cells may be configured in a virtual ground type configuration, with the control gates of the cells in a row individually connected to a wordline. In addition, the source/drain regions of memory cells in a particular column are connected together by a conductive bitline. In operation, individual flash cells and the individual data bits thereof, are addressed via the respective bitlines connected to first and second source/drain regions thereof and a wordline connected to the gate using peripheral decoder and control circuitry for programming (writing), reading, erasing, or other functions.

In most such array configurations the conductive wordlines and bitlines cross one another in accessing the individual flash cells, and therefore must be electrically isolated from one another by an insulative material layer. This wordline-bitline isolation layer may be formed similar to that of conventional LOCOS methods after deposition of the ONO layers and before the deposition of the conductive wordline.

As device densities increase and product dimensions decrease, it is desirable to reduce the size of individual memory cells including the features of the bitlines and wordlines associated with the cells, sometimes referred to as scaling. However, the fabrication techniques used to produce conventional dual-bit SONOS flash memory cells limit or inhibit the designer's ability to reduce cell dimensions. In a conventional manufacturing process whereby a bitline oxide may be formed, an ONO layer is formed on a substrate, over which a patterned resist is formed. An ONO etch is performed using the resist as a mask followed by an implantation to selectively introduce dopant impurities into portions of the substrate associated with prospective bitline regions thereof. The resist is then removed and one or more thermal oxidation processes is used to form a bitline oxide over the bitline and further drive the dopants deeper into the substrate.

Thereafter, a conductive wordline is formed over the ONO and prospective bitline oxide regions, for example, using polysilicon. In order to scale the memory cell devices to facilitate increased device densities, it is desirable to maintain a narrow bitline region without excess dopant diffusion yet obtain a thick bitline oxide layer for better bitline-wordline electrical isolation therebetween. However, limitations in the relatively high temperature and long duration furnace oxidation process used to form the bitline oxide, typically produce excessive bitline dopant diffusion and undesirable bird's beak areas underlying the ONO layer that effectively limit the ability to scale the device within desired performance specifications. Bitline oxides may be formed by current methods, but the thickness of such oxide layers formed over the nitride layer regions causes non-conformality in the oxide profile. Thus, there is a need for improved manufacturing techniques by which dual bit SONOS flash memory devices may be scaled without sacrificing device performance.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

The invention provides methods for fabricating dual bit SONOS and other flash memory cells, involving formation of a bitline oxide structure used to isolate an underlying diffused bitline region from an overlying wordline structure and also used as the second dielectric (e.g. oxide) layer of an ONO stack for active core regions of the memory array. Since this structure has a dual role, that is, in bitline-wordline isolation and in the ONO stack, the structure may be hereinafter referred to as a bitline oxide isolation structure or layer. The method provides for the fabrication of a first dielectric (e.g., oxide, first oxide) layer and a charge trapping (e.g., nitride) layer of a triple layer dielectric-charge trapping-dielectric stack (e.g., ONO stack) formed over a substrate of a wafer. An opening in the first dielectric and charge trapping layers is then etched to form bitline openings down to the substrate. The bitline region is implanted with a dopant (e.g., an n+ dopant ion species) into the substrate associated with the bitline opening in prospective bitline regions to form a conductive diffused bitline structure. A radical oxidation process (e.g., using ozone or another radical oxygen species) is then used in accordance with the method to form a second dielectric (e.g., oxide, second oxide) layer of the triple layer dielectric-charge trapping-dielectric stack over the charge trapping layer and to fill the bitline opening in the prospective bitline regions of the wafer. Finally, a conductive wordline structure is then formed, for example, by a polycrystalline deposition over the triple layer dielectric-charge trapping-dielectric stack and the prospective bitline regions of the wafer.

Thus, in one aspect of the present invention the same material layer, which provides the second oxide layer of the ONO stack is also used to fill the bitline opening to electrically isolate the conductive bitline from the conductive wordline.

The invention thus facilitates the manufacture of scaled memory devices using existing processing steps and a radical oxidation process. Beneficially, in one aspect of the invention, the radical oxidation process uses ozone, and may be accomplished at a lower temperature (e.g., 300–600° C.) than the conventional furnace oxidation process (e.g., typically 800–900° C.) and for a shorter oxidation time (e.g., about 1 to 5 minutes) compared to that for the conventional furnace oxidation (e.g., typically about 1 hour). Further, the lower temperature of the radical oxidation process mitigates excessive bitline dopant diffusion, thereby facilitating scaling of memory cell bitline dimensions.

In another aspect of the present invention, as no dry or wet (steam oxide) processing step is required, less processing steps are needed. In addition, the invention provides for a greater thickness of insulative material between the diffused bitline and the conductive wordline structures, thereby avoiding or mitigating bitline-wordline voltage breakdown problems and less birds beak regions as is experienced in conventional methods and facilitating scaling of memory cell dimensions.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
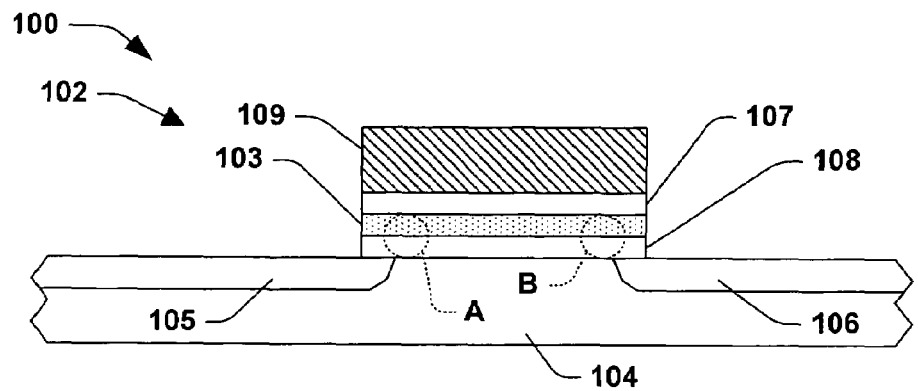
FIG. 1A is a partial side elevation view in section illustrating an exemplary dual bit flash memory cell which may be fabricated in accordance with one or more aspects of the invention.

One or more implementations of the present invention will now be described with reference to the drawings, wherein like reference numerals are used to refer to like elements throughout, and wherein the various structures are not necessarily drawn to scale. The present invention relates to a system and method for fabricating flash memory structures and devices, such as dual bit SONOS type flash memory cells illustrated and described below. However, it will be appreciated that the invention may be employed in fabricating other types of flash memory devices, such as single and multi-bit cells, or others, and that the invention is not limited to the implementations specifically illustrated and described herein.

Figure 1B:
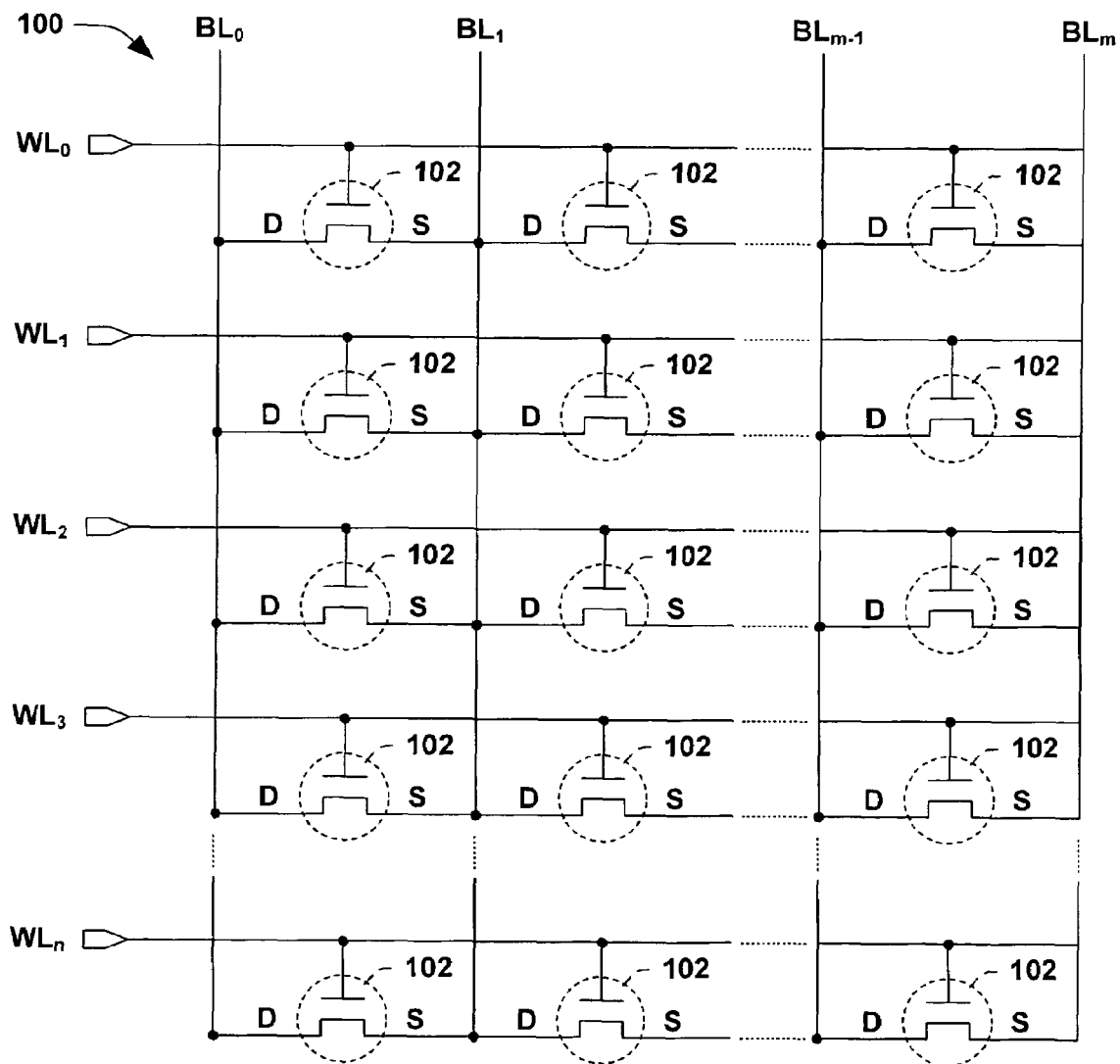
FIG. 1B is a schematic diagram illustrating a portion of an exemplary flash memory array comprising a plurality of dual bit flash memory cells organized in a virtual ground architecture for access using wordlines and bitlines.

Referring initially to FIGS. 1A and 1B, such figures illustrate an exemplary dual bit memory cell 102 and a portion of a virtual ground memory array 100 including one or more interconnected cells 102 in one exemplary simplified form, which may be fabricated in accordance with the various methods of the invention. Thereafter, FIGS. 3–10 and 12 illustrate fabrication of memory cells in accordance with the invention. The memory cell 102 of FIG. 1A comprises a P-type substrate 104 with an n+ source 105 and an n+ drain 106. The cell 102 further comprises a charge trapping layer such as an ONO layer comprising a silicon nitride layer 103 located between upper and lower $SiO_2$ layers 107 and 108, respectively. A polysilicon gate 109 overlies the upper oxide layer 107, and is doped with an n-type impurity (e.g., phosphorus). The memory cell 102 is operable to store and provide access to two data bits, a left bit represented by the dashed circle A and a right bit represented by the dashed circle B. The dual bit memory cell 102 is generally symmetrical, wherein the drain 106 and the source 105 are interchangeable. For example, the left junction 105 may serve as the source terminal and the right junction 106 as the drain terminal with respect to the right bit B. Likewise, the right junction 106 may serve as the source terminal and the left junction 105 as the drain terminal for the left bit A.

An exemplary array 100 of cells 102 is illustrated in FIG. 1B, comprising rows of flash cells 102 with gate terminals coupled to an associated word line (e.g., $WL_0$ thru $WL_n$), and columns cells 102, with a drain of one cell 102 coupled to an associated bit line (e.g., $BL_0$ thru $BL_m$) and the source of an adjacent cell. It is noted in FIG. 1B that each row of flash cells 102 associated with a word line is connected in series, with the source of one cell 102 coupled to the drain of an adjacent cell 102, wherein each drain terminal of the cells 102 within a single column is connected to the same bit line, sometimes referred to as a virtual ground memory architecture. An individual flash cell 102 may thus be selected via application of appropriate voltages to an associated word line and a pair of bit lines bounding the cell 102 of interest. Although the exemplary array 100 of FIG. 1B is illustrated in the present example, it should be understood that one or more aspects of the present invention are also applicable to other array architectures.

FIGS. 2A–2F, illustrate conventional bitline-wordline isolation processing in the fabrication of dual cell SONOS type memory cells in a semiconductor wafer 202 using conventional furnace oxidation processing methods similar to that used in the formation of LOCOS structures. The conventional method of FIGS. 2A–2F begins with the formation of a bitline opening and structure in a prospective bitline region 204 between channel regions 206 of a substrate 208.

Figure 2A:
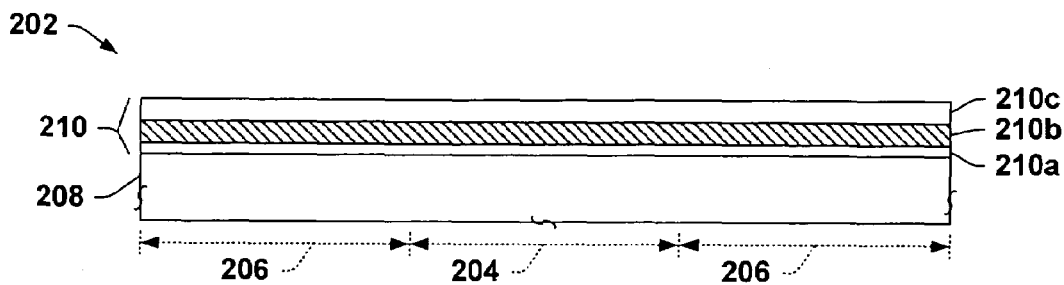
FIGS. 2A–2F are partial side elevation views in section illustrating conventional bitline-wordline isolation processing of a semiconductor wafer to form a bitline-wordline isolation structure in a substrate similar to that of the formation of LOCOS structures using conventional furnace oxidation processing.
Figure 2B:
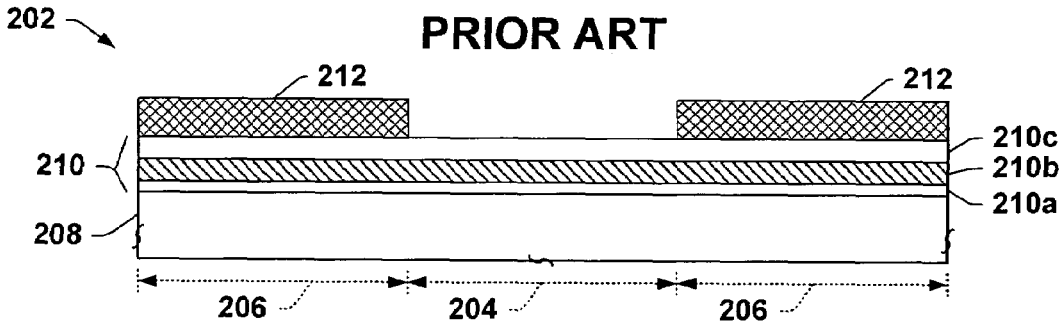

FIG. 2A illustrates the formation of an ONO stack 210 over the substrate 208 in the semiconductor wafer 202, the ONO stack comprising a first oxide layer 210a, a nitride layer 210b, and a second oxide layer 210c. Conventionally, a CVD deposition process may be used to form the second oxide layer 210c. A patterned resist mask 212 may be formed in FIG. 2B, covering portions of the second oxide layer 210c in the channel regions 206 and leaving portions of the second oxide layer 210c exposed in the bitline region 204.

Figure 2C:
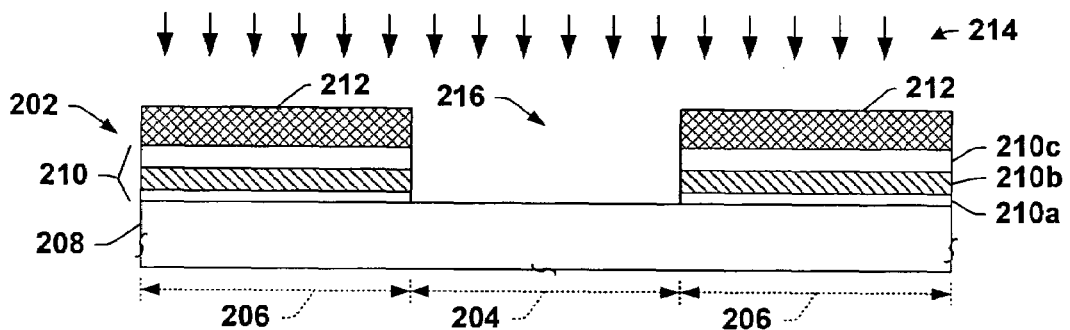
Figure 2D:
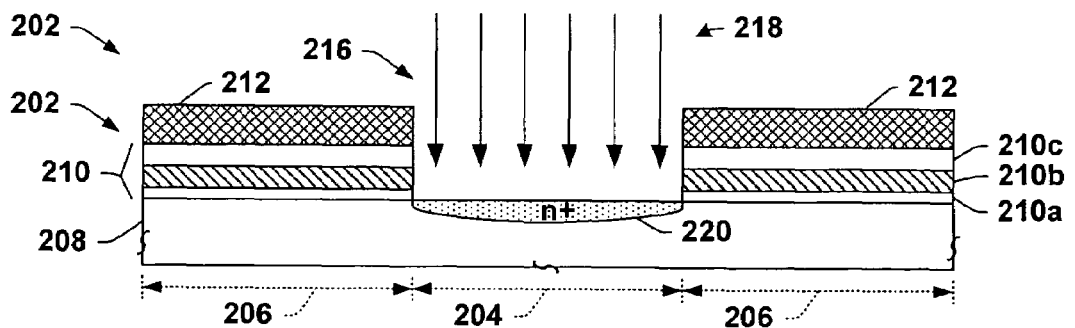
Figure 2E:
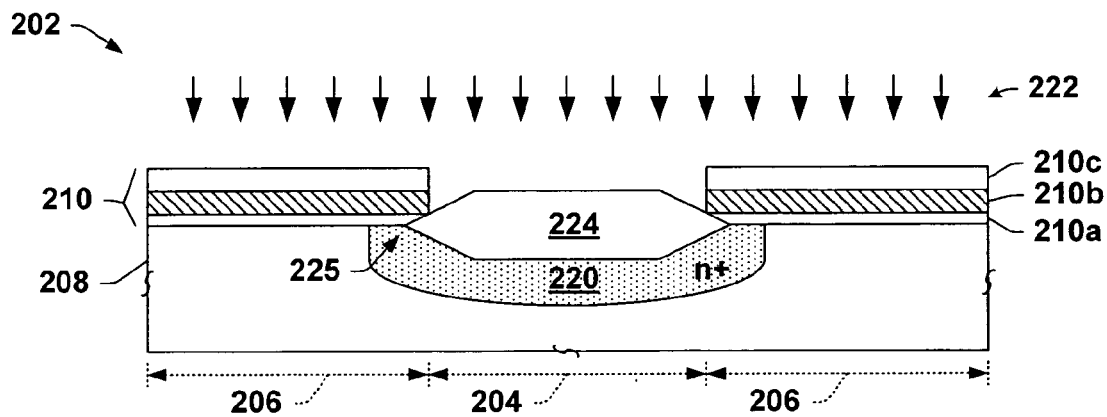

In FIG. 2C, an etch process 214 is employed to form a bitline opening 216 through the ONO stack 210 down to the substrate 208 into which a diffused bitline 220 will be formed in the bitline region 204. In FIG. 2D, a dopant, such as As, is implanted 218 into the substrate 208 through the bitline opening 216 into the bitline region 204. The resist mask 212 is then removed and the wafer cleaned. In FIG. 2E, a furnace oxidation process 222, comprising a higher temperature steam oxidation may be utilized to grow an oxide isolation layer 224 similar to that of a LOCOS structure, for electrical isolation of the diffused bitline 220.

Note, that during the furnace oxidation process 222, the dopant diffusion process continues to grow the size of the diffused bitline 220, due to the relatively high temperature (e.g., 800–900° C.) and long duration (e.g, about 1 hour) of the oxidation process. This excessive diffusion tends to make the diffused bitline 220 grow outside the bitline region 204 and become undesirably wide. Further, the conventional furnace oxidation process 222 allows the oxide isolation layer 224 to grow laterally under the first oxide layer 210a, detrimentally forming a birds' beak area 225 that hinders device performance. The negative effects of the conventional method will be discussed further in association with FIG. 11. Finally, a deposition 228 of, for example, a polycrystalline silicon material may be used and patterned to form a conductive wordline 230 overlying the bitline oxide layer 214 and the ONO stack 210, by which the wafer 202 appears as in FIG. 2F. In the above manner the bitlines 220 and wordlines 230 extend generally perpendicular to one another.

Figure 3:
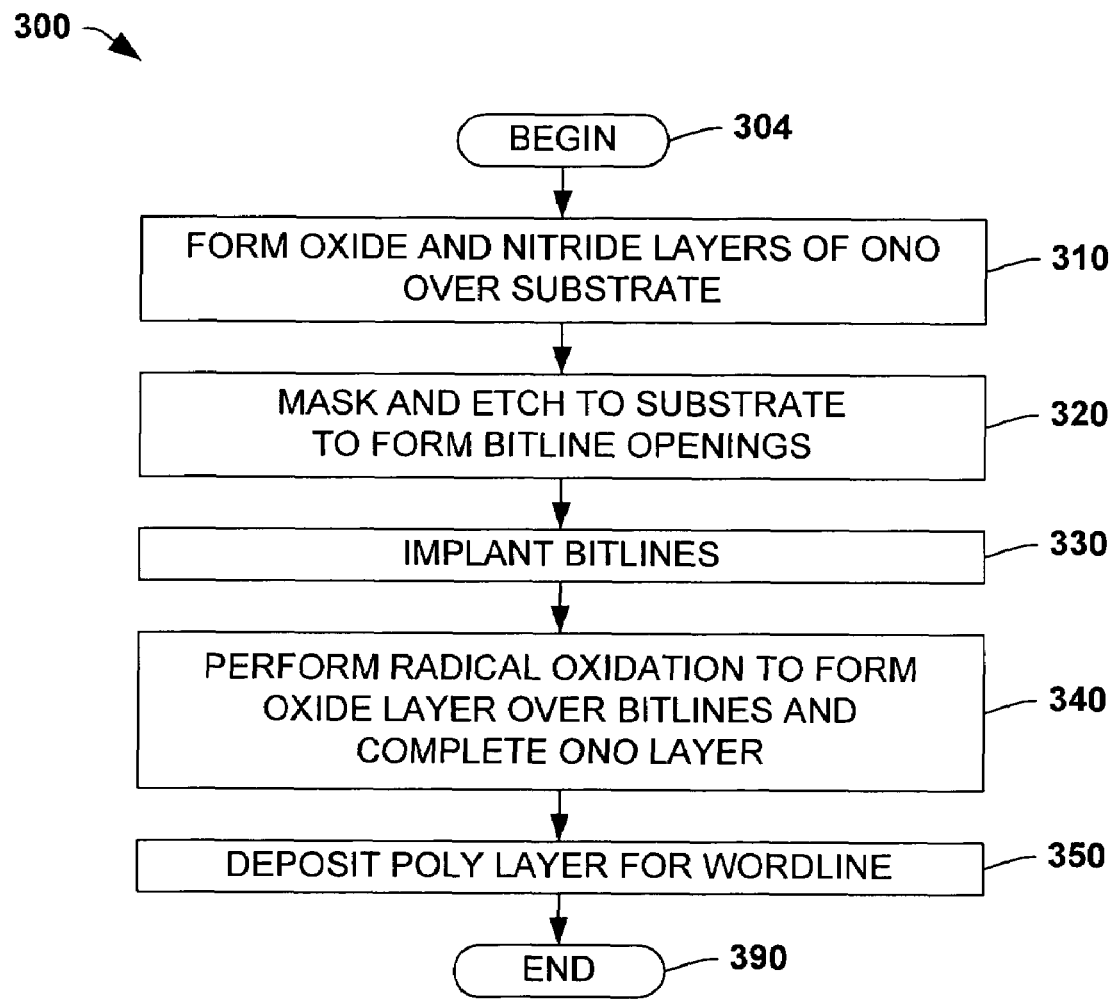
FIG. 3 is a flow diagram illustrating an exemplary method of fabricating flash memory devices in accordance with the present invention.

In FIG. 3, an exemplary method 300 is illustrated for fabricating flash memory cells in a wafer in accordance with one or more aspects of the present invention. Although the method 300 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. In one example, the method 300 or variants thereof, may be used in manufacturing dual bit memory devices and their associated structures, as illustrated and described below with respect to FIGS. 3–10 and 12.

Beginning at 304 of FIG. 3, a first dielectric (e.g., a first oxide) layer and a charge trapping layer (e.g., a nitride layer) of a triple layer charge trapping stack are formed at 310 overlying a substrate, using standard processes. A mask is formed at 320 over selected portions of the first oxide and nitride layers to mask channel regions, for example, using a photoresist, a nitride material layer, or by other selective materials or structures, and the exposed portions are etched down to the substrate to form bitline openings in prospective bitline regions of the substrate. Any appropriate process steps and materials may be employed in forming the first oxide and nitride layers of the ONO layer at 310, including oxidation and/or deposition techniques as are known. The layers formed at 310 can be any other dielectric-charge trapping-dielectric triple layer stack, including but not limited to an ONO stack. In the case of oxide dielectrics, any of the oxide layers can include nitride or other dopants for optimal device and reliability performance. In addition, the nitride layer can be rich in Si, N, and/or dopants such as oxygen to facilitate enhanced device performance and reliability performance.

A dopant, such as As, is implanted at 330 into the substrate through the bitline openings into the prospective bitline regions to form a diffused conductive bitline structure. Thereafter, the masking material or structures may then be removed from the wafer channel regions, for example, using a wet etching operation and the wafer cleaned.

At 340, a radical oxidation process is utilized to rapidly grow a second dielectric (e.g., a second oxide) layer of the ONO stack over the charge trapping or nitride layer, to fill the bitline opening to form a bitline oxide isolation structure or layer, and to diffuse the implanted dopants further into the bitline regions in the wafer. The isolation structure or layer provides electrical insulation/isolation between the bitline and the subsequently formed wordline structures, for example, using SiO or $SiO_2$ grown in the radical oxidation process. The radical oxidation process, in one aspect of the present invention, comprises exposing the semiconductor wafer to a partial pressure of ozone ($O_3$) or radical oxygen of about 0.1% to about 10% and preferably a partial pressure of about 1.0% to about 5.0% at a temperature of about 300° C. to about 600° C. and preferably at a temperature of about 300° C. to about 600° C. for a period of about 1 minute to about 5 minutes. In addition, the ozone or radical oxygen or both may be mixed with oxygen in the above radical oxidation process. Generation of ozone and radical oxygen species may be by any appropriate method known in the art.

Because the radical oxidation process may comprise a decoupled plasma oxidation that adds the energy from the plasma to the system, the inventors of the present invention have realized that a lower processing temperature and/or time may be utilized in the present method compared to the conventional furnace oxidation process discussed.

Thereafter at 350, conductive wordline structures are formed over channel region portions of the substrate and the bitline isolation layer using, for example, a polysilicon (POLY) material layer, or another such conductive material. The deposition of the polysilicon layer may be accomplished using chemical vapor deposition (CVD) processes or other such process that are known, followed by a patterning thereof.

Thus, using the radical oxidation process of the present invention, the charge trapping or ONO layer is completed with the formation of the second oxide layer overlying the channel regions. Accordingly, in the same processing step the bitline openings overlying the diffused bitlines are oxidized to fill and isolate the bitline from the wordline. Thus, unlike the conventional furnace oxidation method described above for the formation of LOCOS type structures, the method 300 advantageously provides an isolation structure or layer that is uniformly thicker, providing an improved bitline-wordline breakdown voltage. In addition, the lower temperature and processing times of the present method, facilitates further scaling of the memory cell dimensions in SONOS and other types of flash memory devices by providing a narrower bitline maintained by improved control of lateral dopant diffusion.

The exemplary method 300 ends at 390, after which further process steps (not shown) may be performed to fabricate other such core memory cell structures and devices of the wafer, followed by metallization and other back end processing. Alternatively, some or all of the peripheral device processing may be carried out in parallel with processing of the core memory cells in accordance with the exemplary method 300 and other methods of the invention.

In FIGS. 4–10, cross sectional views of the fabrication of a bitline oxide isolation structure or layer such as may be used in dual cell SONOS type memory cells in a semiconductor wafer 402 is illustrated in accordance with one or more aspects of the invention of method 300 of FIG. 3. The method of FIGS. 4–10 begins with the formation of a bitline opening and structure in a prospective bitline region 404 between channel regions 406 of a substrate 408.

Figure 4:
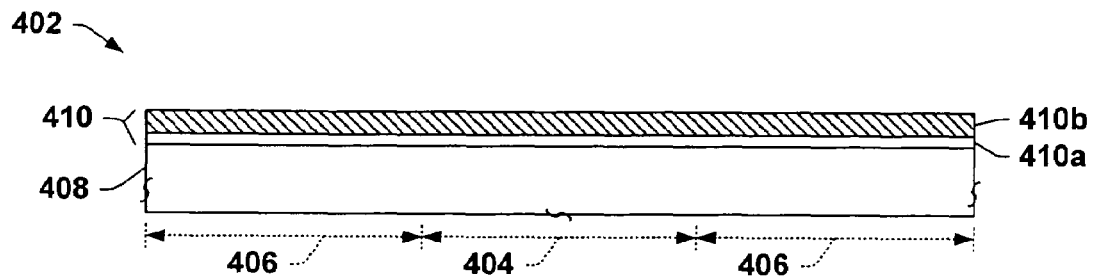
FIG. 4 is a partial side elevation view in section illustrating formation of a first oxide layer and a nitride layer of an ONO stack over a substrate in a semiconductor wafer in accordance with one aspect of the invention of the method of FIG. 3.
Figure 5:
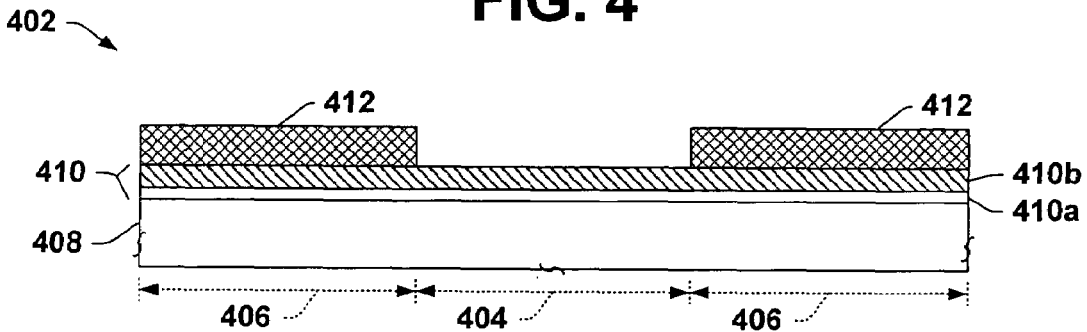
FIG. 5 is a partial side elevation view in section illustrating formation of a mask over channel regions of the first oxide layer and the nitride layer of the ONO stack to form a bitline opening for a prospective bitline region of the wafer of FIG. 4.
Figure 6:
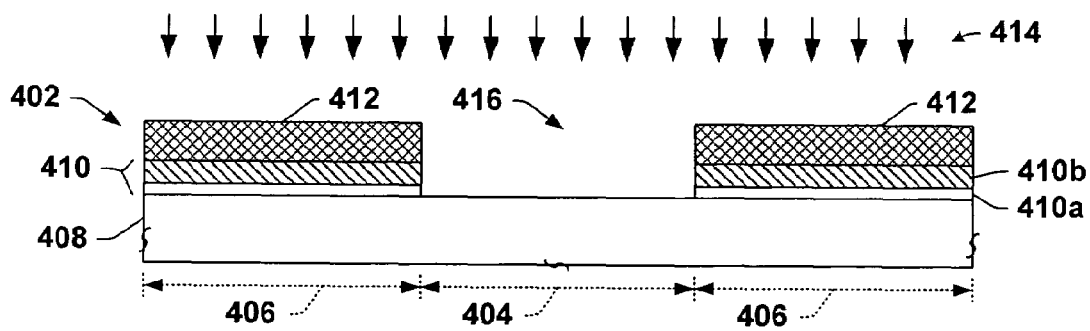
FIG. 6 is a partial side elevation view in section illustrating an etch process to remove a portion of the first oxide layer and the nitride layer of the ONO stack down to the substrate for the formation of a bitline opening in a prospective bitline region of the wafer of FIG. 5.

In FIG. 4, an initial portion of an ONO layer or stack 410 is formed, comprising a first dielectric layer 410a, such as $SiO_2$ formed over the substrate 408, as well as a charge trapping (e.g., nitride) layer 410b formed over the first oxide 410a formed such as through individual deposition and/or oxidation steps (not shown). In FIG. 5, a mask 412 is formed over selected portions of the first oxide layer 410a and nitride layer 410b by patterning to mask channel regions 406 of the wafer 402. For example, masking may be accomplished using a photoresist, a nitride material layer, or other selective materials or structures. Thereafter in FIG. 6, an etch process 414 removes the exposed portions of the first oxide layer 410a and nitride layer 410b down to the substrate 408 to form a bitline opening 416 in a prospective bitline region 404 of the wafer 402. Any appropriate process steps may be employed in patterning the first oxide 410a and nitride 410b layers of the ONO stack 410, including dry etch chemistries as are known.

Figure 7:
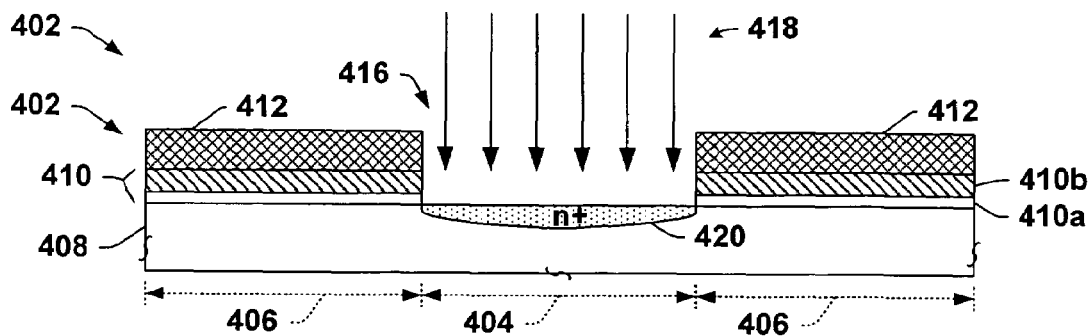
FIG. 7 is a partial side elevation view in section illustrating a bitline implantation process providing dopants to the bitline region of the substrate in the wafer of FIG. 6.

In FIG. 7, a dopant, such as As, or another n-type ion species is implanted 418 into the substrate 408 of wafer 402 through the bitline opening 416 into the prospective bitline region 404 to form a diffused conductive bitline structure 420. Thereafter, the masking material 412 or structures used for masking may then be removed from the wafer channel regions 406, for example, using a wet or dry etching operation and the wafer is cleaned, for example, with a rinse process.

Figure 8:
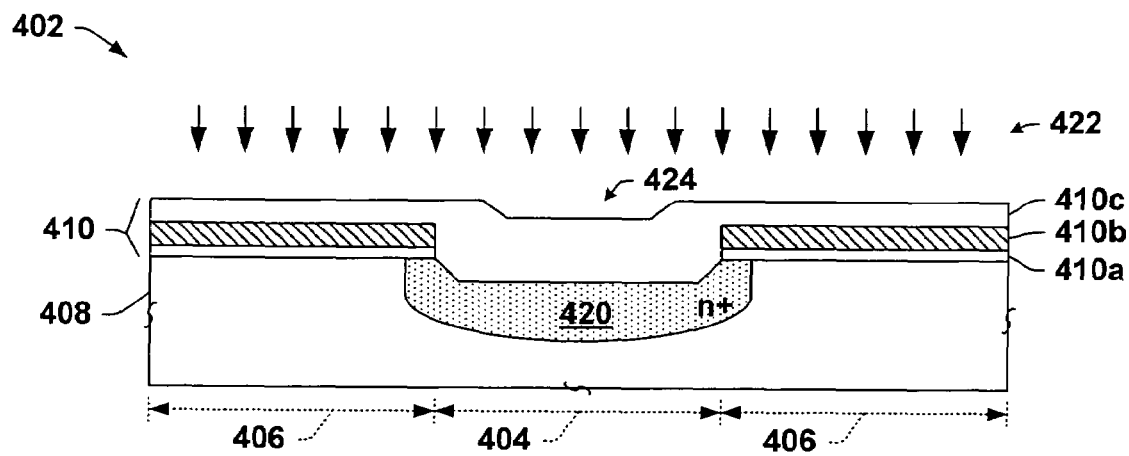
FIG. 8 is a partial side elevation view in section illustrating a radical oxidation process to rapidly grow a second oxide layer of the ONO stack over the nitride layer and filling the bitline opening to form a bitline-wordline insulator structure and to diffuse the implanted dopants further into the bitline region in the wafer of FIG. 7.

In FIG. 8, a radical oxidation process 422 is utilized to rapidly grow a second oxide layer 410c (e.g., SiO or $SiO_2$) of the charge trapping or ONO stack 410 over the nitride layer 410b, to fill the bitline opening 416. Such process also incidentally causes the implanted dopants to diffuse further into the bitline region 404 in the wafer 402. Functionally, the second oxide layer 410c has a dual role, it acts as a bitline oxide isolation structure 424 in the bitline region 404 to provide electrical insulation between the bitline and the wordline structures (shown in FIG. 9), while over the channel regions 406, the second oxide layer 410c acts as the third dielectric material of the ONO stack 410 used for charge trapping functions. Accordingly, in the radical oxidation process, the silicon oxide material of the isolation structure 424 (sometimes referred to as a bitline oxide or bitline oxide layer) is provided by the oxidation of some of the silicon substrate material 408 in the bitline region 404, and is also provided by the oxidation of the SiN material of the nitride layer 410b in the channel regions 406.

Figure 9:
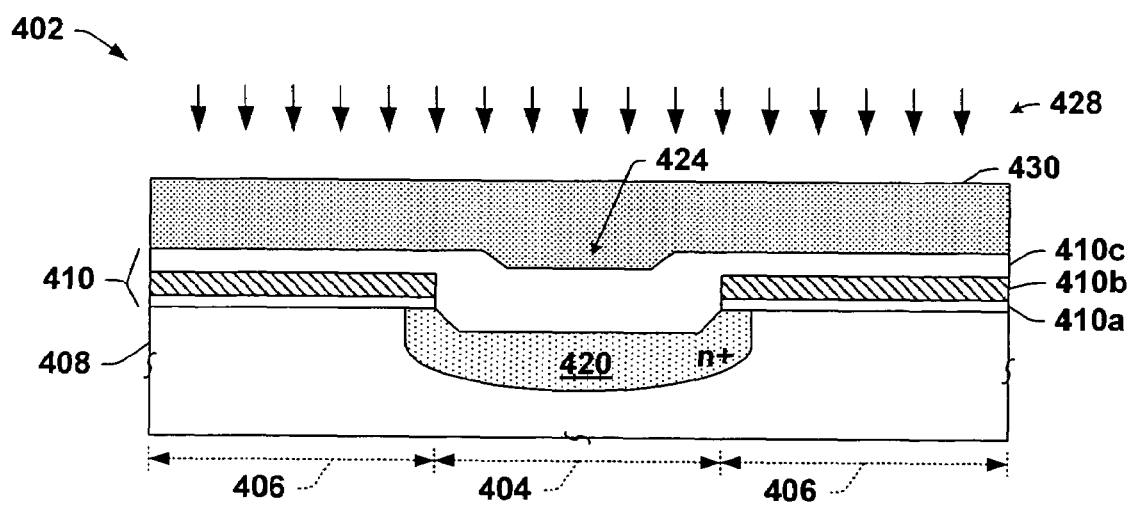
FIG. 9 is a partial side elevation view in section illustrating deposition of a first polysilicon layer over the ONO stack and the bitline-wordline insulator structure to form a wordline on the wafer of FIG. 8.

Although the oxidation rate of the SiN layer 410b is much slower than that of the silicon substrate 408, the implantation of As in the bitline implant step 330 further accelerates the oxidation process of the silicon substrate 408 to fill the bitline opening and improve the surface leveling effect between the bitline oxide layer 410c and the subsequently formed wordline layer 430 in the bitline region 404 as shown in FIG. 9.

In one aspect of the present invention, the radical oxidation process comprises exposing the semiconductor wafer 402 to a partial pressure of ozone ($O_3$) or radical oxygen of about 0.1% to about 10% and preferably a partial pressure of about 1.0% to about 5.0%. In another aspect of the invention, the radical oxidation process occurs at a temperature of about 300° C. to about 600° C. and preferably at a temperature of about 300° C. to about 600° C. In still another aspect of the invention, the radical oxidation process occurs for a period of about 1 minute to about 5 minutes. In addition, the ozone or radical oxygen or both may be mixed with oxygen in any of the above radical oxidation process variations.

Finally in FIG. 9, a conductive wordline structure may be formed over the second oxide layer 410c (bitline oxide layer) via a deposition process 428 of a polysilicon (POLY) material layer 430, or another such conductive material. The deposition 428 of the polysilicon layer 430 may be accomplished using chemical vapor deposition (CVD) processes or other such process that are known. The polysilicon is then patterned to form wordlines.

Figure 10:
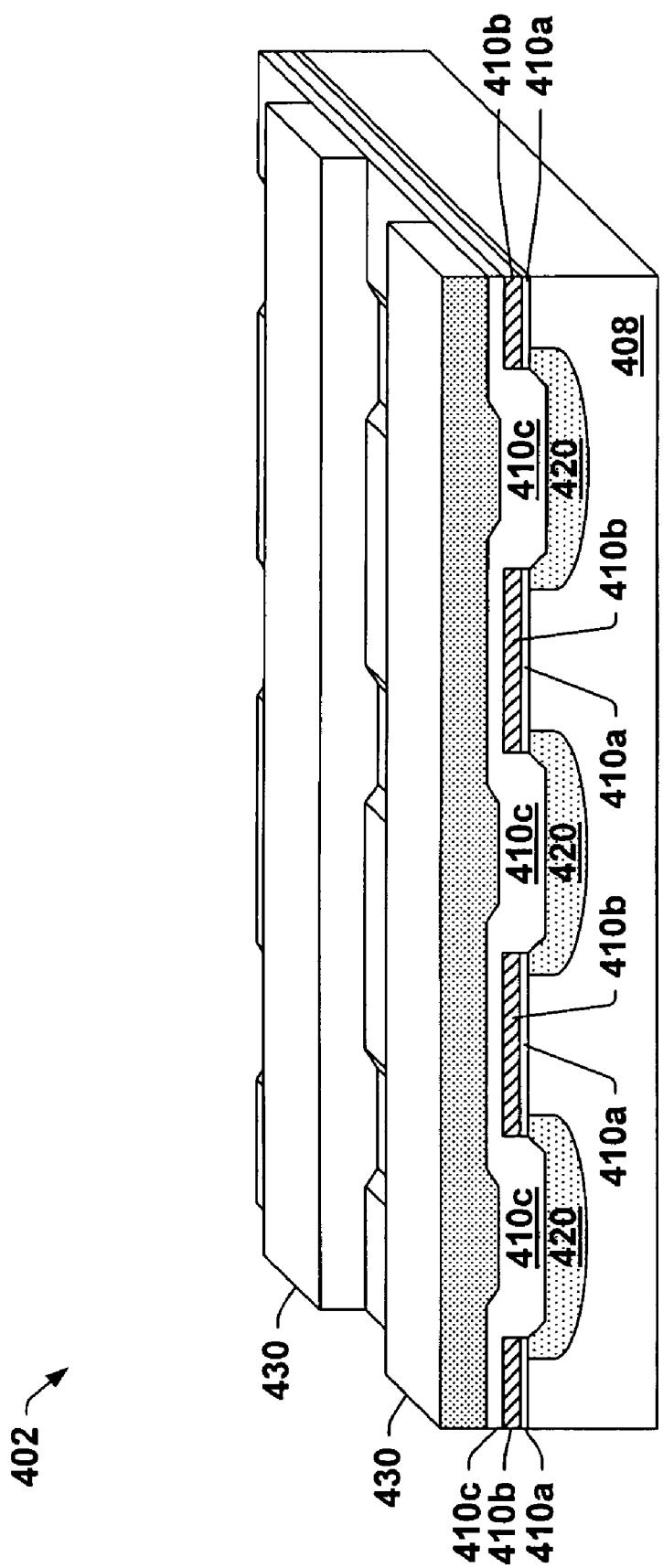
FIG. 10 is a perspective view of a portion of the core region of a SONOS type memory device in accordance with one aspect of the invention of the method of FIGS. 3–9.

FIG. 10 illustrates a perspective view of the core region of the SONOS type memory device fabricated in accordance with one aspect of the invention of the method of FIGS. 3–9. Note that with reduced lateral diffusion of the bitline, the channel lengths of the cells are well-controlled, thereby facilitating scaling to smaller dimensions.

Figure 2F:
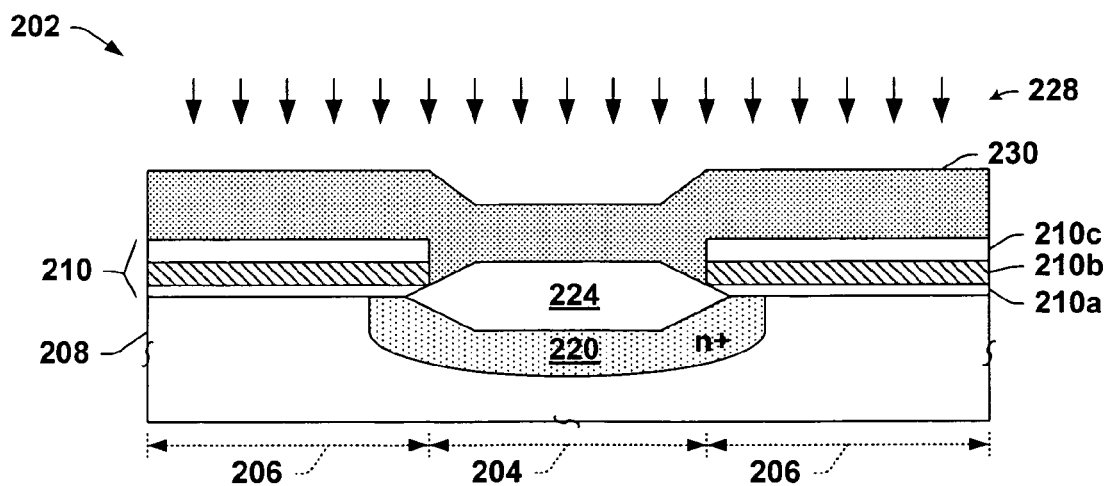
Figure 11:
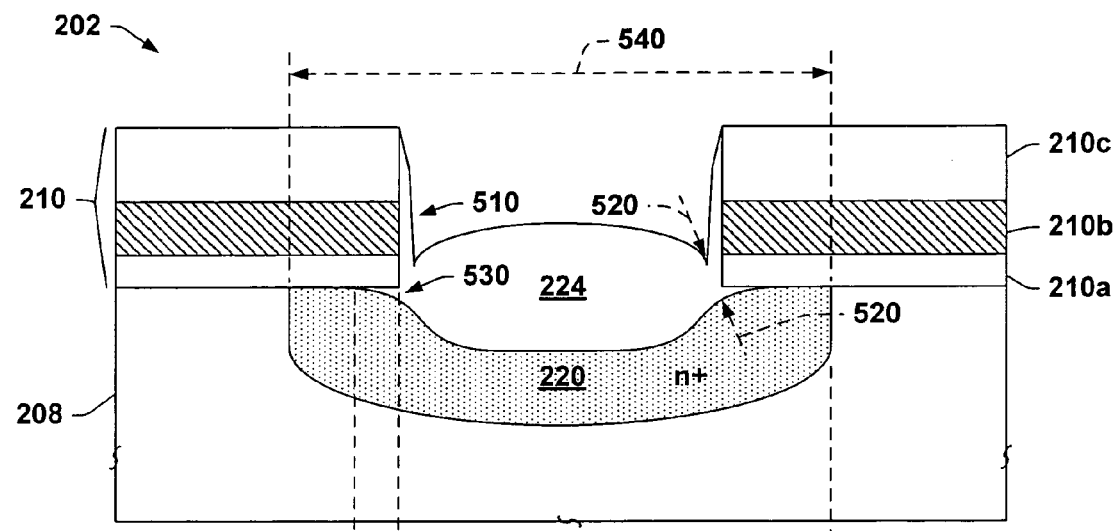
FIG. 11 is a partial side elevation view in section illustrating the conventional LOCOS bitline-wordline isolation structure similar to that of FIGS. 2E and 2F formed using conventional furnace oxidation processing methods, and further illustrating non-conformal oxide growth, bird's beak areas, and excessive bitline dopant diffusion.
Figure 12:
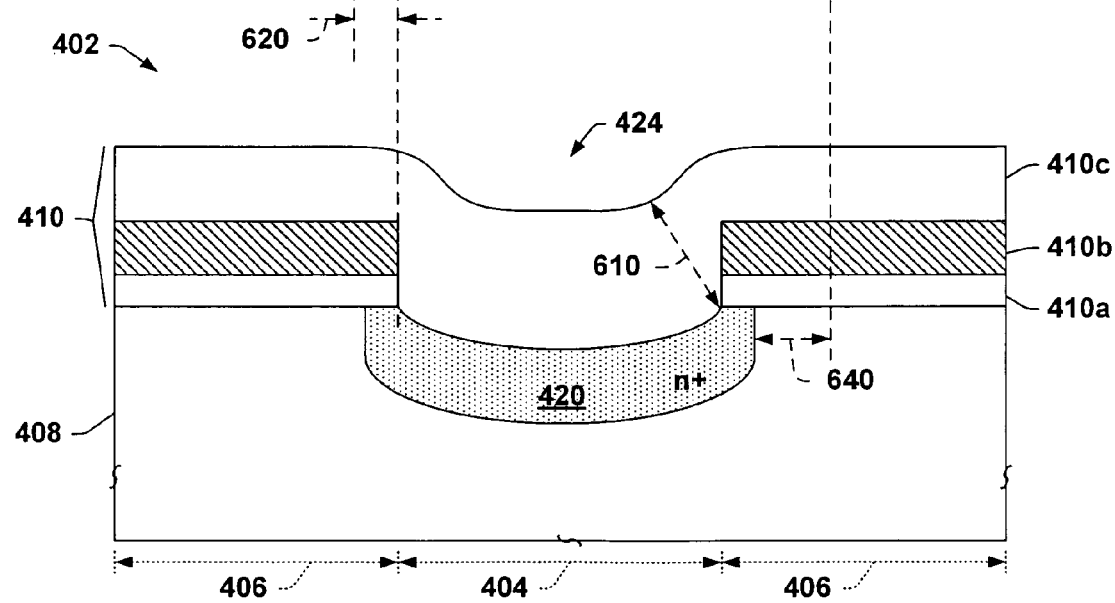
FIG. 12 is a partial side elevation view in section illustrating the bitline oxide isolation isolation structure similar to that of FIGS. 8–10 formed using the radical oxidation processing methods of the present invention, further illustrating improved conformal oxide growth, less bird's beak areas, and improved narrow bitline dopant diffusion.

FIGS. 11 and 12 contrast the results of the conventional fabrication methods described in association with FIGS. 2E and 2F to those of the method of the present invention of FIGS. 3–10, respectively.

Prior art FIG. 11 illustrates additional details of a core region of a wafer 202 fabricated by the convention method described in association with FIGS. 2E and 2F for the formation of a conventional LOCOS type bitline-wordline isolation structure 224 using conventional furnace oxidation processing methods 222. FIG. 11 further illustrates the problems in non-conformal oxide growth areas 510, or thin oxide isolation areas 520, bird's beak areas 530, and excessive bitline dopant diffusion width 540.

FIG. 12 illustrates the bitline oxide isolation structure 424 (using the second oxide layer 410c) similar to that of device 402 of FIGS. 8–10 formed using the radical oxidation processing method 300 of the present invention. FIG. 12 further illustrates improved conformal oxide thickness 610 in support of a larger bitline-wordline breakdown voltage, reduced bird's beak growth 620 for improved memory device improvement, and improved (narrower) bitline dopant diffusion 640 to support deeper device scaling trends.

Thus, in FIGS. 11 and 12, the employment of the radical oxidation process and the formation of the second oxide layer 410c of the ONO stack 410 after the bitline implant step (330) provides an isolation structure 424 between the bitline 420 and the wordline 430 as well as the third dielectric layer 410c of the ONO stack 410 in a single processing step 340. In addition, the use of the radical oxidation process 340 together the specific ordering of the process steps of the present invention mitigates excessive thermal diffusion of the bitline implant otherwise present in conventional thermal processing steps. Thus, the invention advantageously facilitates reduction of bitline width for scaling of the memory devices in the wafer 402.

Thereafter, further processing steps (not shown) are performed to fabricate peripheral devices, such as transistors, in core and peripheral regions of the wafer 402, and to form metal layers or other interconnect structures, using back end processes as are known. It will be appreciated that alternatively, some processing of the peripheral circuitry may be performed while processing the memory cells in the core region. For example, peripheral gate masking an etching may be performed while forming the wordlines in the core region using the polysilicon layer 430.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fabricating a flash memory cell in a wafer, comprising:
   forming a first dielectric layer and a charge trapping layer of a triple layer dielectric-charge trapping-dielectric stack over a substrate;
   selectively etching the dielectric and charge trapping layers down to the substrate to form a bitline opening in a bitline region;
   implanting a dopant ion species into the substrate associated with the bitline opening to form a bitline;
   performing a radical oxidation process after forming the bitline to form a second dielectric layer of the triple layer dielectric-charge trapping-dielectric stack over the charge trapping layer and filling the bitline opening; and
   forming a wordline structure over the second dielectric layer, thereby covering the triple layer dielectric-charge trapping-dielectric stack and the bitline region.

2. The method of claim 1, further comprising removing a photoresist mask and cleaning the wafer before implanting the dopant ion species into the substrate associated with the bitline opening in the bitline region.

3. The method of claim 1, wherein the triple layer dielectric-charge trapping-dielectric stack comprises a first dielectric layer overlying the substrate, a nitride layer overlying the first dielectric layer, and a second dielectric layer overlying the nitride layer.

4. The method of claim 1, wherein the first dielectric layer of the triple layer dielectric-charge trapping-dielectric stack comprises a first dielectric layer overlying the substrate, and the second dielectric layer of the triple layer dielectric-charge trapping-dielectric stack comprises a second dielectric layer overlying the nitride layer and the bitline opening.

5. The method of claim 1, wherein the wordline structure formed over the triple layer dielectric-charge trapping-dielectric stack and the bitline regions of the wafer comprises a polysilicon material layer.

6. The method of claim 1, wherein the bitline regions is formed by diffusion of an n+ dopant within the substrate.

7. The method of claim 1, wherein the radical oxidation process comprises a decoupled plasma oxidation utilizing a partial pressure of ozone or a radical oxygen species of about 0.1% to about 10% and preferably a partial pressure of ozone of about 1.0% to about 5.0%.

8. The method of claim 1, wherein the radical oxidation processing temperature is performed at about 300° C. to about 600° C. and preferably at a temperature of about 300° C. to about 600° C.

9. The method of claim 1, wherein the radical oxidation processing time comprises about 1 minute to about 5 minutes.

10. The method of claim 1, wherein the radical oxidation process takes place in a partial pressure of ozone or a radical oxygen species of about 0.1% to about 10% and preferably a partial pressure of about 1.0% to about 5.0% at a temperature of about 300° C. to about 600° C. and preferably at a temperature of about 300° C. to about 600° C. for a period of about 1 minute to about 5 minutes.

11. The method of claim 1, wherein forming the triple layer dielectric-charge trapping-dielectric stack comprises:
forming a first dielectric layer over the substrate;
forming a nitride layer over the first dielectric layer; and
forming a second dielectric layer over the nitride layer and within the bitline opening before forming the wordline structure.

12. The method of claim 1, wherein the triple layer dielectric-charge trapping-dielectric stack comprises an ONO layer.

13. A method of fabricating a multi-bit SONOS flash memory cell, comprising:
forming a first dielectric layer and a charge trapping layer over a substrate of a wafer;
selectively etching the dielectric and charge trapping layers down to a substrate region to form a bitline opening;
implanting a dopant ion species into the substrate associated with the bitline opening thereby forming a bitline region; and
performing a radical oxidation process after forming the bitline to form a second dielectric layer of a triple layer dielectric-charge trapping-dielectric stack over the charge trapping layer and filling the bitline opening over the bitline.

14. The method of claim 13, further comprising forming a wordline structure over the triple layer dielectric-charge trapping-dielectric stack and the bitline regions of the wafer after the performing the radical oxidation process.

* * * * *